United States Patent
Rauf et al.

(10) Patent No.: US 7,579,282 B2
(45) Date of Patent: Aug. 25, 2009

(54) METHOD FOR REMOVING METAL FOOT DURING HIGH-K DIELECTRIC/METAL GATE ETCHING

(75) Inventors: Shahid Rauf, Pflugerville, TX (US); Olubunmi O. Adetutu, Austin, TX (US); Eric D. Luckowski, Round Rock, TX (US); Peter L. G. Ventzek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 373 days.

(21) Appl. No.: 11/331,786

(22) Filed: Jan. 13, 2006

(65) Prior Publication Data

US 2007/0166973 A1    Jul. 19, 2007

(51) Int. Cl.
*H01L 21/285* (2006.01)
*H01L 21/3065* (2006.01)

(52) U.S. Cl. ............... 438/713; 438/739; 257/E21.038; 257/E21.626; 257/E21.64

(58) Field of Classification Search ................ 438/592, 438/182, 720, 736, 9, 40, 254, 494, 498, 438/634, 669–673, 733–734, 738–739, 748, 438/924, 940, FOR. 109, FOR. 115, 230, 438/573, 595, 596, 696, 713; 156/634.1; 257/E21.214–E21.316, E21.038, E21.626, 257/E21.64

See application file for complete search history.

(56) References Cited

U.S. PATENT DOCUMENTS

| | | | | |
|---|---|---|---|---|
| 4,528,066 A | * | 7/1985 | Merkling et al. | 438/696 |
| 5,202,291 A | * | 4/1993 | Charvat et al. | 438/696 |
| 5,368,686 A | * | 11/1994 | Tatsumi et al. | 438/696 |
| 5,981,148 A | * | 11/1999 | Brown et al. | 430/314 |
| 5,994,226 A | * | 11/1999 | Kadomura | 438/695 |
| 6,077,789 A | * | 6/2000 | Huang | 438/720 |
| 6,509,221 B1 | * | 1/2003 | Doris et al. | 438/199 |
| 6,586,288 B2 | | 7/2003 | Kim et al. | 438/183 |
| 6,589,858 B1 | * | 7/2003 | Dakshina-Murthy et al. | 438/592 |
| 6,638,833 B1 | * | 10/2003 | Vassalli et al. | 438/454 |
| 6,638,874 B2 | | 10/2003 | Yi et al. | 438/720 |
| 6,686,292 B1 | * | 2/2004 | Yang et al. | 438/710 |
| 6,696,345 B2 | | 2/2004 | Chau et al. | 438/387 |

(Continued)

OTHER PUBLICATIONS

N. Fujiwara et al., "Profile Control of poly-Si Etching in Electron Cyclotron Resonance Plasma," Jpn. J. Appl. Phys. vol. 34, (1995), pp. 2095-2100.

(Continued)

*Primary Examiner*—W. David Coleman
*Assistant Examiner*—Maliheh Malek
(74) *Attorney, Agent, or Firm*—Hamilton & Terrile, LLP; Michael Rocco Cannatti

(57) ABSTRACT

A metal layer etch process deposits, patterns and anisotropically etches a polysilicon layer (24) down to an underlying metal layer (22) to form an etched polysilicon structure (54) with polymer layers (50, 52) formed on its sidewall surfaces. The polymer layer (50, 52) are removed to expose an additional surface area (60, 62) of the metal layer (22), and dielectric layers (80, 82) are formed on the sidewall surfaces of the etched polysilicon structure (54). Next, the metal layer (22) is plasma etched to form an etched metal layer (95) with substantially vertical sidewall surfaces (97, 99) by simultaneously charging the dielectric layers (80, 82) to change plasma ion trajectories near the dielectric layers (80, 82) so that plasma ions (92, 94) impact the sidewall surfaces (97, 99) in a more perpendicular angle to enhance etching of the sidewall surfaces (97, 99) of the etched metal layer (95).

20 Claims, 5 Drawing Sheets

| | | | | |
|---|---|---|---|---|
| 6,818,488 B2* | 11/2004 | Joubert et al. | ............... | 438/179 |
| 6,955,964 B2* | 10/2005 | Haselden et al. | ............ | 438/257 |
| 7,235,473 B2* | 6/2007 | Jawarani et al. | ............ | 438/592 |
| 7,235,478 B2* | 6/2007 | Geng et al. | ................ | 438/634 |
| 7,303,983 B2* | 12/2007 | Triyoso et al. | ............. | 438/592 |
| 2001/0019127 A1* | 9/2001 | Ishida | ......................... | 257/59 |
| 2002/0088478 A1* | 7/2002 | Degendt et al. | ................ | 134/3 |
| 2002/0164884 A1* | 11/2002 | Lishan | ...................... | 438/739 |
| 2003/0068899 A1* | 4/2003 | Bachmann et al. | ......... | 438/720 |
| 2004/0023478 A1* | 2/2004 | Samavedam et al. | ........ | 438/592 |
| 2004/0115909 A1* | 6/2004 | Lee et al. | .................... | 438/585 |
| 2004/0214385 A1 | 10/2004 | Doczy et al. | ............... | 438/199 |
| 2004/0253823 A1* | 12/2004 | Taq et al. | .................... | 438/691 |
| 2005/0026345 A1* | 2/2005 | Adetutu et al. | ............ | 438/199 |
| 2005/0233562 A1* | 10/2005 | Adetutu et al. | ............ | 438/585 |
| 2006/0017122 A1* | 1/2006 | Chau et al. | ................. | 257/413 |
| 2006/0084217 A1* | 4/2006 | Luo et al. | .................... | 438/199 |
| 2006/0084235 A1* | 4/2006 | Barr et al. | .................... | 438/300 |
| 2006/0094259 A1* | 5/2006 | Gilmer et al. | ............. | 438/785 |
| 2006/0110892 A1* | 5/2006 | Orlowski et al. | ............ | 438/435 |
| 2006/0154487 A1* | 7/2006 | Wang et al. | ................ | 438/714 |
| 2006/0166424 A1* | 7/2006 | Schaeffer et al. | ............ | 438/199 |
| 2006/0234436 A1* | 10/2006 | Tseng et al. | ................ | 438/216 |
| 2006/0270239 A1* | 11/2006 | Triyoso et al. | ............. | 438/706 |
| 2007/0042546 A1* | 2/2007 | Thomas et al. | .............. | 438/257 |
| 2007/0155113 A1* | 7/2007 | Roberts et al. | .............. | 438/396 |
| 2007/0166902 A1* | 7/2007 | Orlowski et al. | ............ | 438/197 |
| 2007/0166970 A1* | 7/2007 | Triyoso et al. | ............. | 438/585 |
| 2007/0190711 A1* | 8/2007 | Luo et al. | .................... | 438/197 |
| 2007/0196988 A1* | 8/2007 | Shroff et al. | ................ | 438/299 |
| 2008/0248649 A1* | 10/2008 | Adetutu et al. | ............. | 438/692 |
| 2008/0254617 A1* | 10/2008 | Adetutu et al. | ............. | 438/643 |

OTHER PUBLICATIONS

T. Shimmura et al., "Effects of Fluorocarbon Gas Species on Electrical Conductivity and Chemical Structure of Deposited Polymer in $SiO_2$ Etching Process," J. Vac. Sci. Technol. B 22(2), Mar./Apr. 2004, pp. 533-538.

S. Tabara, "New Metal Etching Method for Reducing Electron Shading Damage," J. Vac. Sci. Technol. B 15(3), May/Jun. 1997, pp. 675-680.

M. Yoneda et al., "Etched Profile Distortions in High Density Electroc Cyclotron Resonance Plasma," J. Vac. Sci. Technol. B 12(6), Nov./Dec. 1994, pp. 3363-3368.

S. Tabara et al., "Study of the Influence of Gas Chemistry on Notching in Metal Etching," J. Vac. Sci. Technol. B 16(2) Mar./Apr. 1998, pp. 553-557.

* cited by examiner

METHOD FOR REMOVING METAL FOOT DURING HIGH-K DIELECTRIC/METAL GATE ETCHING

BACKGROUND OF THE INVENTION

1. Field of the Invention

The present invention is directed in general to the field of semiconductor devices. In one aspect, the present invention relates to the fabrication of metal gate electrodes used in semiconductor devices.

2. Description of the Related Art

As the size and scaling of semiconductor device technology is reduced, the requirements for device design and fabrication—such as reducing the length of gate electrodes—continue to tighten. There are also increased requirements for transistor performance (e.g., increased speed, lower power dissipation) with newer technologies. An additional challenge posed by decreasing feature sizes is that aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology is increasingly replacing silicon dioxide gate dielectrics and polysilicon gate conductors with high dielectric constant (high-k) dielectrics in combination with gate electrodes formed from one or more metal layers. With such technologies, metal gates not only obviate gate-depletion and boron-penetration effects, but also provide a significantly lower resistance.

While high-k dielectrics in conjunction with metal gate electrodes advantageously exhibit improved transistor performance, the metal layer portion of the gate electrodes can be difficult to etch with conventional gate etch techniques, making it difficult to control the gate length of such electrodes. But when transistors gates formed from polysilicon and metal layer are etched in a conventional manner, wide metal gate foot or ledge features are observed that extend far beyond the polysilicon gate. An example of such a foot/ledge feature is shown in FIG. 1, which depicts a partial cross-sectional view of a semiconductor structure 1 including a substrate 2, a dielectric layer 6 and a conventionally etched gate electrode 3 formed from a metal layer 4 and a polysilicon layer 8. With existing gate etch processes, the gate electrode 3 includes wide metal gate feet or ledges 5 formed from the metal layer 4 and extending beyond the polysilicon gate 8, both horizontally along a shelf region 7 and then down a tapered region 9 to the dielectric layer 6. These feet 5 can significantly increase the transistor length and degrade transistor electrical performance. The feet also would have pitch (line to line) spacing dependencies due to polymerization which is impacted by shadowing. These feet therefore will vary in dimension, resulting in not only degraded performance, but variable performance. Prior attempts to control the fabrication of metal gates have relied on overly complex processes that sidestep or ignore the sidewall profile issues created by metal etch processes.

Accordingly, a need exists for an improved metal gate electrode and manufacture method for reducing or eliminating the metal feet or ledges or extrusion. There is also a need for a controlled fabrication process that reliably produces metal gate electrodes with improved sidewall profiles. In addition, there is a need for improved semiconductor device structure and manufacturing process to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
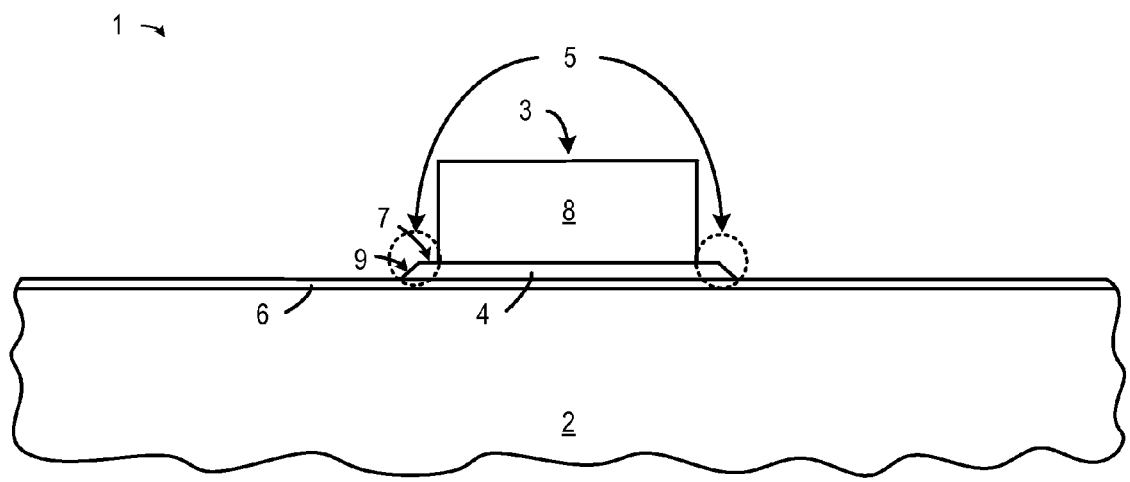
FIG. 1 is a partial cross-sectional view of an semiconductor structure including a conventionally etched metal/polysilicon transistor gate having wide metal gate feet or ledges extending beyond the polysilicon gate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A multi-layered device feature in a semiconductor structure, such as a metal gate electrode, and its method of manufacture are described for fabricating the device feature to have a predetermined sidewall profile, such as a vertical sidewall without any feet or ledge features. For example, a poly/metal gate electrode may be fabricated to reduce or eliminate a shelf region at the metal layer by including a polymer clean or etch process after the polysilicon etch to remove any polymer that masks the metal film underneath it during etching. By cleaning the polymer from the polysilicon sidewall surfaces prior to metal etching, the size of the shelf region is reduced or eliminated entirely. In addition or in the alternative, the poly/metal gate electrode may be fabricated to reduce or eliminate a tapered region at the metal layer by forming nonconductive charge storage layers (such as a thin dielectric fluorocarbon polymer layer, nitride layer or oxide layer) on the polysilicon sidewall surfaces prior to metal etching which act to directionalize a metal etch process that is prone to charging effects, thereby increasing the etch rate at the tapered region of the metal layer. With the approach(es) described herein, a metal gate electrode structure with a smaller bottom critical dimension is obtained by etching the metal gates without forming foots or ledges, though other device features may also be fabricated to remove or reduce feet or ledge features. By etching metal gates without feet or ledge features, the gate length will be substantially reduced and transistor electrical characteristics (speed, leakage current, process variability) will be improved.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art.

Figure 2:
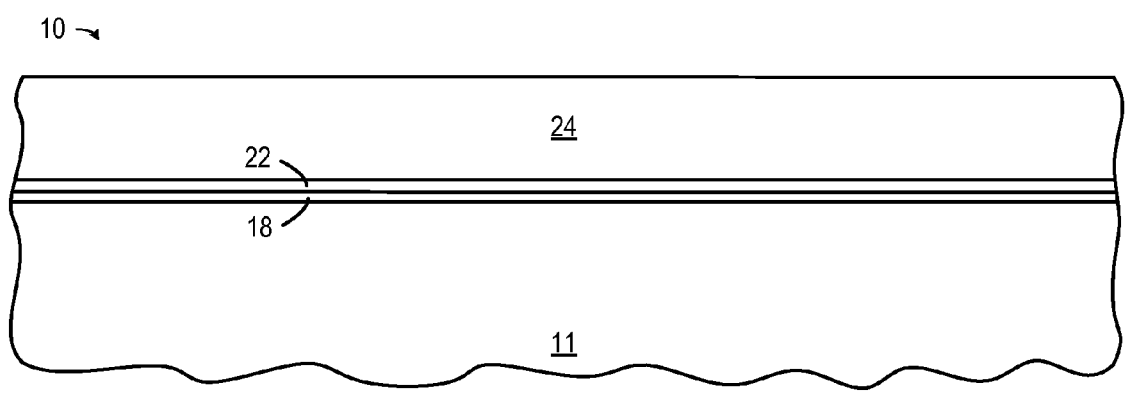
FIG. 2 is a partial cross-sectional view of a semiconductor structure including a substrate, a gate dielectric layer and an unetched gate stack including at least a polysilicon layer and a metal layer formed over the gate dielectric layer.

Turning now to FIG. 2, a partial cross-sectional view is depicted of a semiconductor structure 10, including a substrate 11, a gate dielectric layer 18 and an unetched gate stack including at least a first layer 24 (e.g., a polysilicon layer) and a second layer 22 (e.g., a metal layer) formed over the gate dielectric layer 18. Depending on the type of device being fabricated, the substrate 11 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 11 may be implemented as the top silicon layer of a silicon-on-insulator (SOI) structure. Though not illustrated, one or more isolation regions and/or well regions may be formed in the substrate 11 to define one or more active regions over which the transistor devices are formed. Prior to forming the unetched gate stack, an insulator or dielectric layer 18 is formed by depositing or growing an insulator or high-k dielectric (e.g., silicon dioxide, oxynitride, metal-oxide, nitride, etc.) over the semiconductor substrate 11 using chemical vapor deposition (CVD), plasma-enhanced chemical vapor deposition (PECVD), physical vapor deposition (PVD), atomic layer deposition (ALD), thermal oxidation, or any combination(s) of the above. In an illustrative implementation, first dielectric layer 18 is a metal-oxide compound formed by chemical vapor deposition or by atomic layer deposition having a typical final thickness is in the range of 1-5 nanometers, though other thicknesses may be used. A suitable metal oxide compound for use as first dielectric layer 18 is hafnium oxide (preferably $HfO_2$), though other oxides, silicates or aluminates of zirconium, aluminum, lanthanum, strontium, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $LaSiO_X$, $YSiO_X$, $ScSiO_X$, $CeSiO_X$, $HfLaSiO_X$, $HfAlO_X$, $ZrAlO_X$, and $LaAlO_X$, $Si_3N_4$, and $SiO_XN_Y$. In addition, multi-metallic oxides (for example barium strontium titanate, BST) may also provide high-k dielectric properties.

After forming the first dielectric layer 18, an unetched gate stack is formed using any desired metal gate stack formation sequence. For example, one or more conductive layers are sequentially deposited or formed over the first dielectric layer 18 to form a first gate stack that includes at least a (doped or undoped) polysilicon layer 24 formed over a metal gate layer 22. In one embodiment, the metal gate layer 22 is formed by depositing or sputtering a $Ta_xC_y$ layer having a thickness in the range of 1-20 nanometers, though other gate layer materials may be used (such as $TaC_XN_Y$ or TaSiN) with different thicknesses. The polysilicon layer 24 may be formed from heavily doped polysilicon using CVD, PECVD, PVD, ALD, or any combination(s) thereof to a thickness in the range of approximately 10-200 nanometers, though other materials (e.g., tungsten or another suitable electrically conductive material) and thicknesses may be used.

Figure 3:
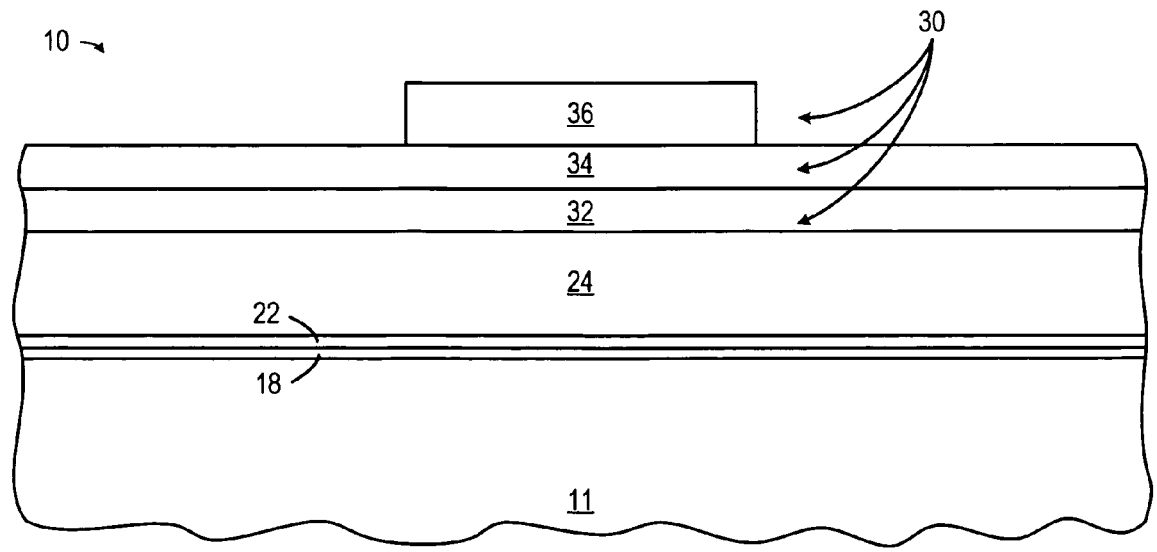
FIG. 3 illustrates processing subsequent to FIG. 2 after one or more masking layers are formed on the polysilicon layer.

Once the unetched gate stack is formed, an etched gate stack may be formed by first selectively etching the polysilicon layer 24 using any desired pattern and etching processes to form an etched gate stack over the semiconductor substrate 11, including application and patterning of photoresist directly on the polysilicon layer 24. However, multi-layer masking techniques may also be used, such as illustrated in FIG. 3 which shows processing of the semiconductor structure 10 subsequent to FIG. 2 after one or more masking layers 30 are formed on the polysilicon layer 24 for use in a narrow gate patterning process. As depicted, the masking layers 30 are formed by sequentially depositing or forming a first masking layer 32 (such as an organic anti-reflective coating (ARC) layer), a second masking layer 34 (such as a hardmask or TEOS layer) and a photoresist layer (not shown) which is patterned and trimmed to form the resist pattern 36. The first masking layer 32 is formed over the polysilicon layer 24 with a material that will act as a hard mask when the polysilicon layer 24 is subsequently etched. Likewise, the second masking layer 34 is formed from a material (such as a dielectric material) that will serve as a hard mask for the etching of the first masking layer 32. As for the photoresist layer, it may be formed from any appropriate photoresist material (e.g., 193 nm resist) that is patterned (e.g., using a 193 nm develop) and etched to form a resist pattern 36 over the second masking layer 34.

Figure 4:
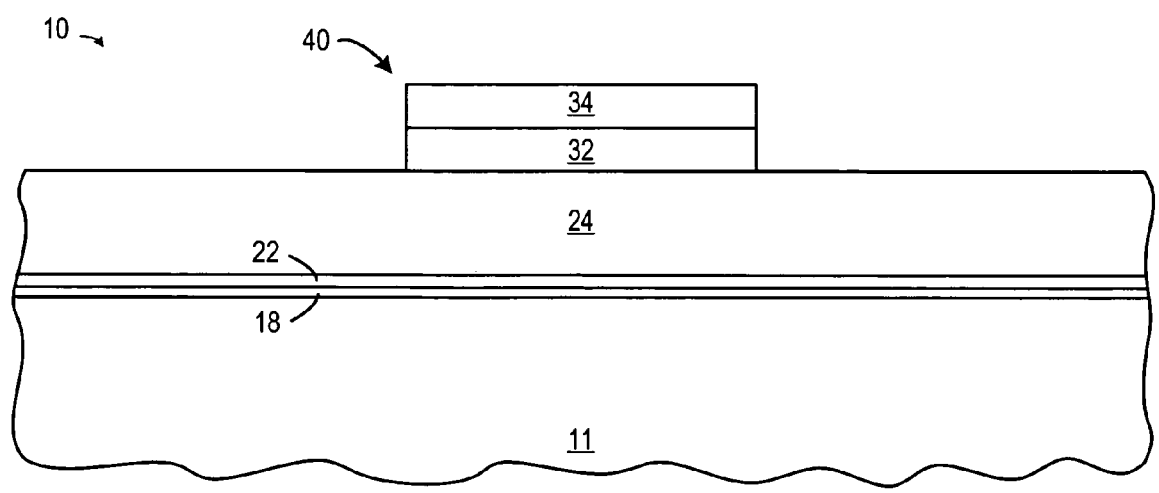
FIG. 4 illustrates processing subsequent to FIG. 3 after the masking layers are selectively etched to leave an etch mask over an unetched polysilicon layer.

FIG. 4 illustrates processing of the semiconductor structure 10 subsequent to FIG. 3 after the masking layers 30 are selectively etched to leave an etch mask 40 over an unetched polysilicon layer 24, such as by etching the hard mask layer 34 and ARC layer 32. In an illustrative embodiment, the resist pattern 36 (depicted in FIG. 3) is used to etch the exposed portions of the second masking layer 34 (e.g., by using a selective etchant process, such as an argon, $CF_4$ chemistry). The remaining or unetched portion(s) of the second masking layer 34 are then used as a hard mask to pattern the first masking layer 32 so that the exposed portions of the first masking layer 32 are removed (e.g., by using a selective etchant process, such as an argon, $O_2$, HBr chemistry).

Figure 5:
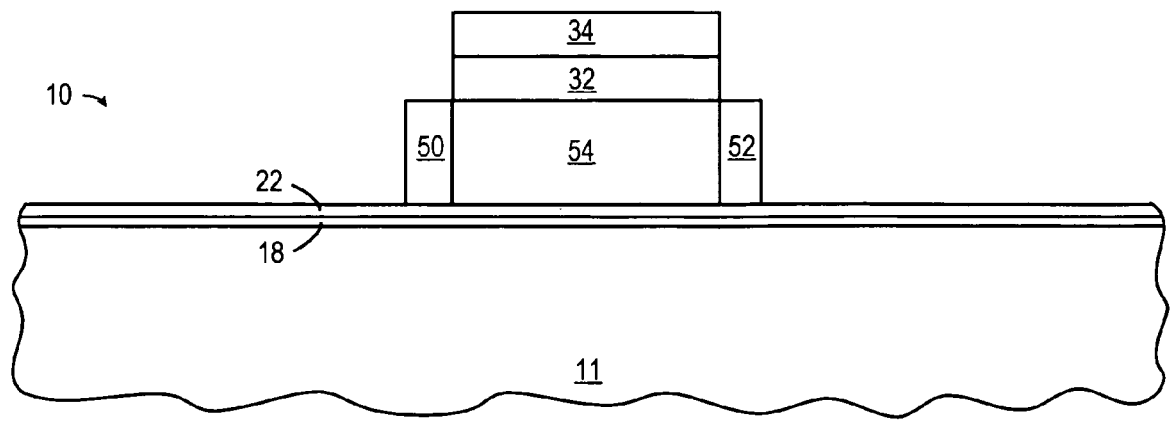
FIG. 5 illustrates processing subsequent to FIG. 4 after the etch mask is used to anisotropically etch the polysilicon layer down to the metal layer.

FIG. 5 illustrates processing of the semiconductor structure 10 subsequent to FIG. 4 after the etch mask 40 is used to anisotropically etch the polysilicon layer 24 down to the metal layer 22, thereby forming an etched polysilicon layer 54. As illustrated, the remaining or unetched portion(s) of the first and second masking layers 32, 34 are used as a hard mask to pattern the polysilicon layer 24. The exposed portions of the polysilicon layer 24 are then removed, such as by etching or removing the exposed portions of the polysilicon layer 24 with a standard silicon dry etch chemistry containing chlorine, bromine or fluorine generating species. In the course of anisotropically etching the polysilicon layer, polymer layers 50, 52 are formed on the exposed sidewall surfaces of the etched polysilicon layer 54. The relatively thick polymer layers 50, 52 can effectively act as mask layers for the underlying metal layer 22 during any subsequent metal etch step, resulting in the formation of a shelf region in the etched metal layer that extends out past the etched polysilicon layer 54.

Figure 6:
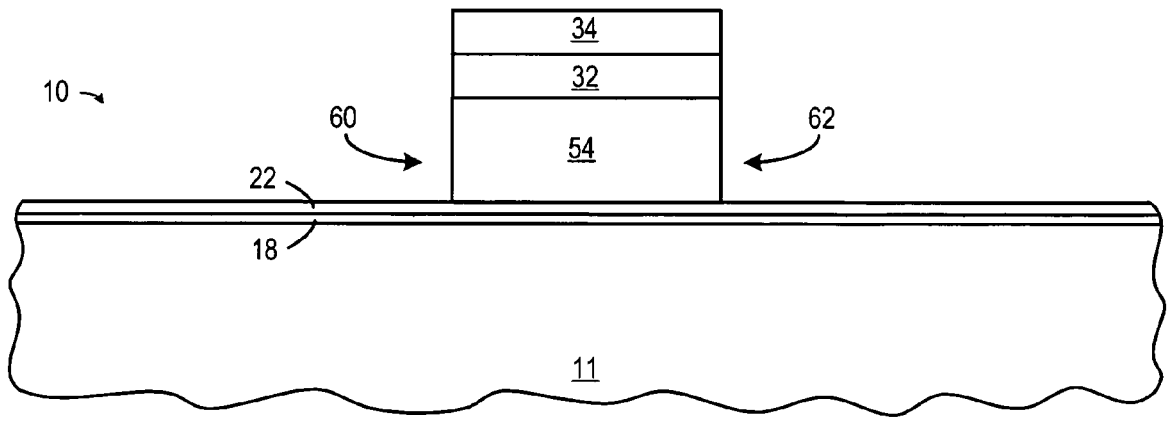
FIG. 6 illustrates processing subsequent to FIG. 5 after removal of sidewall polymer from the etched polysilicon layer.

To address the masking effect from the polymer layers 50, 52, various embodiments of the present invention include a polymer clean or etch process after the polysilicon etch to remove any polymer layers 50, 52 that would mask the underlying metal film if they remained during etching. This is depicted in FIG. 6 which illustrates processing of the semiconductor structure 10 subsequent to FIG. 5 after removal of sidewall polymer layers 50, 52 from the etched polysilicon layer. As illustrated, the polymer etch or clean step exposes the polysilicon sidewalls 60, 62 and part of the metal layer 22 that would otherwise have been covered and masked by the polymer layers 50, 52. Though the polymer layers 50, 52 may be removed with any desired process, selected embodiments of the present invention clean the polymer layers 50, 52 from the exposed surfaces of the etched polysilicon layer 54 using a plasma etch process or wet clean process. These clean processes can for example contain $O_2$.

Figure 7:
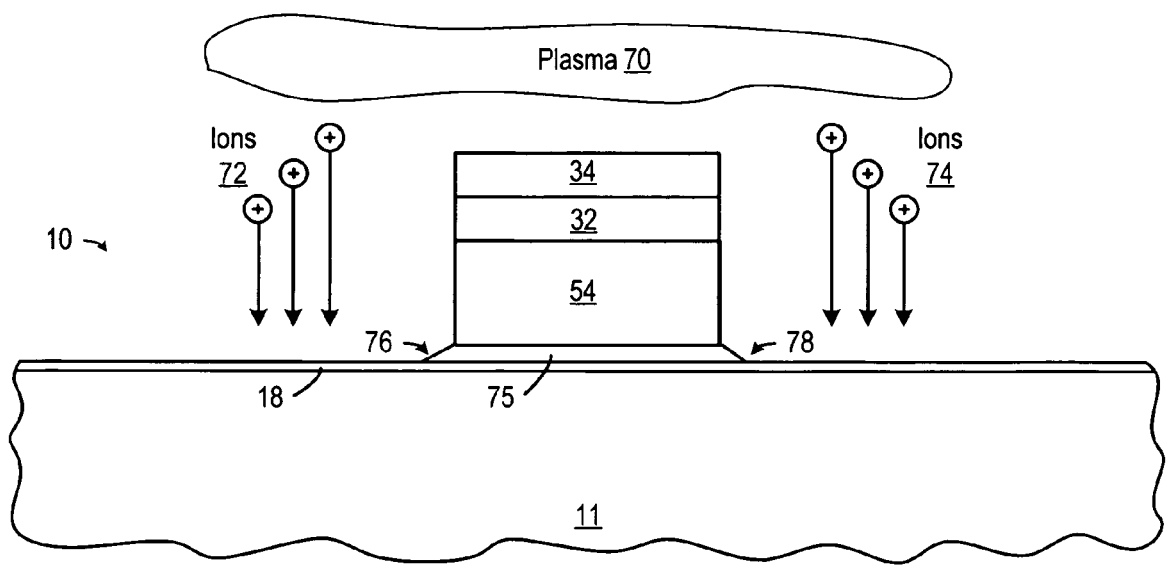
FIG. 7 illustrates processing subsequent to FIG. 6 after the metal layer is etched to form a gate having a reduced metal foot in accordance with a first illustrative embodiment.
Figure 8:
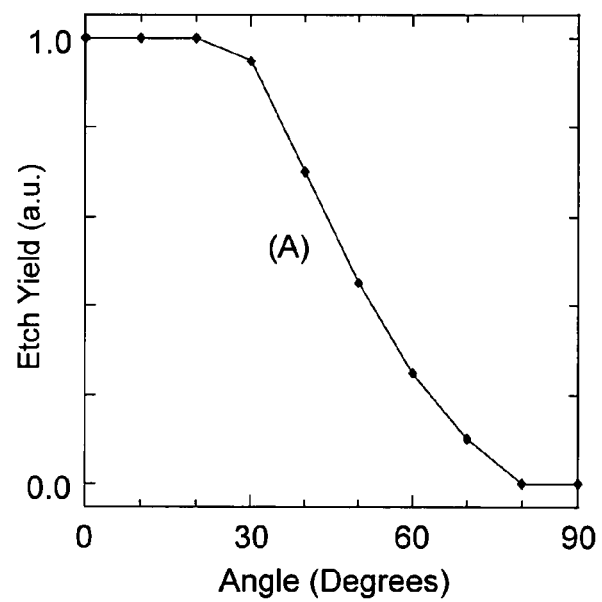
FIG. 8 is a graphical depiction of the angular dependence of a metal etch yield.

By cleaning or otherwise removing the polymer layers 50, 52 prior to metal etching, the size of any foot or ledge feature is significantly reduced by eliminating the shelf region, though the sidewall of the metal layer 22 is still tapered. This is depicted in FIG. 7, which illustrates processing subsequent to FIG. 6 after the metal layer 22 is etched to form a gate electrode having a metal layer 75 with a reduced metal foot or ledge feature 76, 78 in accordance with a first illustrative embodiment. As illustrated, a plasma etch process 70 is applied whereby ions 72, 74 anisotropically etch the metal layer 75. Because the masking polymer layers 50, 52 were removed, there is no shelf region on the etched metal layer 75. However, due to the angular dependence of the plasma process used to etch the metal (discussed below), sloped sidewall features 76, 78 on the etched metal layer 75 remain after the metal etch process. The resulting tapered surfaces 76, 78 are caused by the metal etch rate being slower near the corners of a layer being etched. The ions bombard the corner at an off-normal angle and ion etch yield is smaller at the off-normal angle. This is illustrated in FIG. 8, which graphically depicts the angular dependence of a metal etch yield by graphing how the ion etch yield for a $Ta_xC_y$ metal material decreases with ion impact angle.

To prevent formation of the sloped sidewall features 76, 78 on an etched layer, selected embodiments of the present invention use an angled etch process to remove the ledge or foot from a layer (e.g., an etched metal layer). By decreasing the impact angle (with respect to surface normal) of ions used in a plasma etch process near the corners (so that the ion impact trajectory is perpendicular to the surface of the material being etched), the etch rate at the corner increases.

While the impact angle of the plasma etch ions may be controlled in a variety of ways, a selected embodiment of the present invention controls the impact angle by forming charge storage layers in the semiconductor structure which establish localized electric fields that influence the trajectory of ions from the plasma near the corner. An illustrative implementation is depicted beginning with FIG. 9, which illustrates processing of the semiconductor structure 10 subsequent to FIG. 6 after formation of charge storing layers 80, 82 on the sidewalls of the etched polysilicon layer 54. Following the cleaning of the polymer layers 50, 52 from the etched polysilicon sidewalls, an illustrative embodiment of the present invention forms thin charge storage layers by depositing thin dielectric fluorocarbon polymer layers 80, 82 on the polysilicon sidewall. In a selected implementation, suitable non-conductive dielectric layers 80, 82 may be formed from fluorocarbon polymer films that are not irradiated by ions and do not have —C=C— bonds, such as by using $CF_4$ or $C_2F_6$ based plasma and high gas pressure to grow non-conductive polymer in a decoupled or inductively coupled plasma etch reactor. In another implementation, thin non-conductive coatings 80, 82 may be formed by oxidizing or nitridating the exposed surfaces of the etched polysilicon layer 54 by applying an $O_2$ or $N_2$ plasma to form thin dielectric film layers. These dielectric films 80, 82 have the same benefits as the fluorocarbon polymer and will be extremely thin due to the self-limiting nature of the deposition process. However, if the surface of the etched polysilicon layer 54 is oxidized, then the anisotropic etch of the polysilicon layer 24 (described above) should be controlled to stop the etch from reaching the metal layer 22 so as to avoid oxidation of metal layer 22.

It will be appreciated that the thin dielectric layers 96, 98 may be removed from the sidewalls of the etched polysilicon layer 54 after formation of the etched metal layer 95 before proceeding with other fabrication steps. However, the dielectric layers 96, 98 may also be retained and/or used as a sidewall spacer during subsequent processes (such as source/drain implantation or silicide formation), either alone or in combination with other liner or spacer components.

Figure 9:
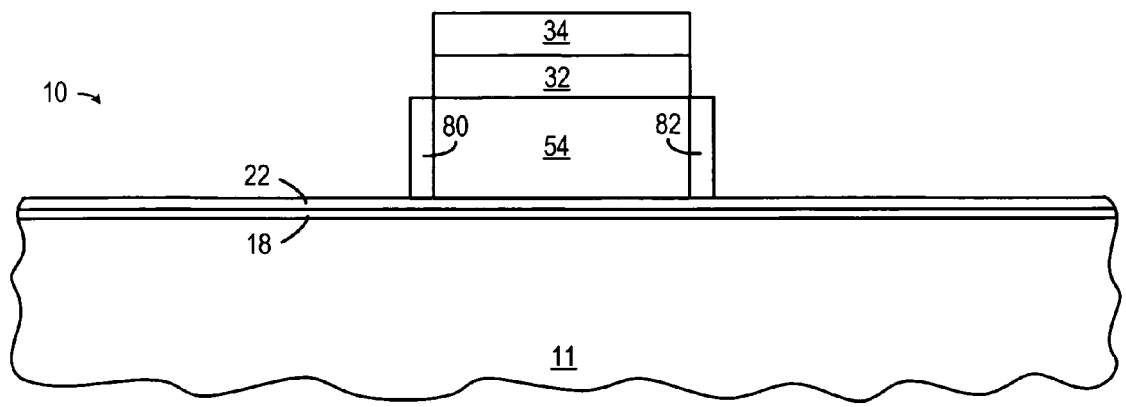
FIG. 9 illustrates processing subsequent to FIG. 6 after formation of charge storing layers on the sidewalls of the etched polysilicon layer in accordance with a second illustrative embodiment.
Figure 10:
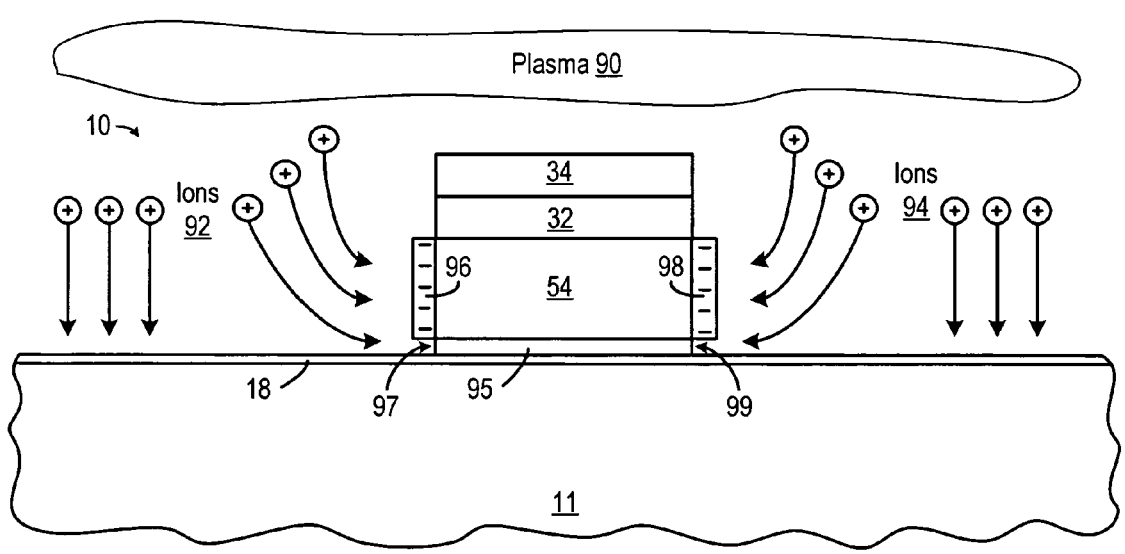
FIG. 10 illustrates processing subsequent to FIG. 9 after etching of the metal layer in accordance with the second illustrative embodiment.

FIG. 10 illustrates processing of the semiconductor structure 10 subsequent to FIG. 9 after etching the metal layer 22 to form an etched metal layer 95 using an etch process that is prone to localized charging effects introduced by charges stored in the thin dielectric layers 96, 98. As illustrated, a plasma etch process 90 is applied whereby ions 92, 94 anisotropically etch the metal layer 95. By using a metal etch process that is prone to charging, the thin dielectric layers 96, 98 charge up negatively, which changes the trajectory of nearby ions 92, 94 in a manner that they will bombard the corner region of the metal layer 95 in a more vertical angle and enhance the etch rate there. As a result, the tapered surfaces are reduced or eliminated so that the metal layer 95 has substantially vertical sidewall edges 97, 99. In accordance with various embodiments of the present invention, charge storage may be promoted by using high source power in decoupled or inductively coupled plasma etch reactors and by adding $BCl_3$ to a $Cl_2$ etching plasma. Other operating conditions that promote charge storage with inductively coupled plasma reactors include creating higher electron temperatures and lower bias power. As will be appreciated, electron temperature can be raised by diluting the etch plasma with He, and the bias power can be reduced with the reactor controls. By creating localized charges in the thin dielectric layers 96, 98 in the course of etching the metal layer 95, the metal etch process is directionalized to increase the etch rate at the tapered region of the metal layer, thereby forming a poly/metal gate electrode having an etched metal layer 95 with vertical sidewalls 97, 99.

Possible applications for the etched metal layers 75, 95 include use in metal gate electrodes used in transistor devices. In such applications, it will be appreciated that additional processing steps will be used to complete the fabrication of the metal gate electrodes into functional transistor devices. As examples, one or more sacrificial oxide formation, stripping, isolation region formation, extension implant, halo implant, spacer formation, source/drain implant, silicide formation, heat drive or anneal steps, and/or polishing steps may be performed, along with conventional backend processing (not depicted), typically including formation of multiple levels of interconnect that are used to connect the transistors in a desired manner to achieve the desired functionality. In addition, other semiconductor device levels may be formed underneath or above semiconductor structure 10. Thus, the specific sequence of steps used to complete the fabrication of the transistor devices may vary, depending on the process and/or design requirements.

While the illustrative embodiments are described with reference to forming an etched metal layer in a metal gate electrode of a MOSFET transistor device, it will be appreciated that various embodiments of the present invention can be used for any future technology (including CMOS technology) that uses metal gates and high-k dielectrics, and can also be used to tailor the polysilicon gate foot profile in conventional CMOS transistors. Other possible applications of the layer etch techniques disclosed herein include etching layers (such as metal or polysilicon layers) included in non-volatile memory (NVM) transistor devices (such as a nanocluster stack-based NVM devices and floating gates transistor devices), Fin Field Effect Transistors (FinFETs), Double gate Fully Depleted Semiconductor-on-Insulator (FDSOI) transistors or other transistor geometries.

In one form, there is provided herein a method for forming a feature in a semiconductor structure by forming a first layer (e.g., from polysilicon or a metal-based material, such as $Ta_xC_y$, $Ta_xN_y$, $Mo_xN_y$, $TaSi_xN_y$, $Ti_xN_y$, W, or $W_xN_y$) over a substrate, depositing a polysilicon layer on the first layer, and then anisotropically etching the polysilicon layer down to the first layer to form an etched polysilicon structure having at least one sidewall surface on which is formed a polymer layer. After removing the polymer layer from the sidewall surface of the etched polysilicon structure (e.g., using a plasma etch or wet clean process), an additional surface area on the first layer is exposed. With the additional surface area exposed, a plasma etch process is applied using the etched polysilicon structure for alignment to obtain an etched first layer having a substantially vertical sidewall. After removing the polymer layer and before plasma etching the first layer, a dielectric layer may optionally formed on the sidewall surface of the etched polysilicon structure, such as by depositing a fluorocarbon polymer film or oxidizing nitridating the sidewall surface of the etched polysilicon structure using an appropriate plasma. With the dielectric layer in place during plasma etching, the plasma etch process forms a sidewall surface of the first layer while simultaneously charging the dielectric layer to change plasma ion trajectories near the dielectric layer so that plasma ions impact the sidewall surface of the first layer in a more perpendicular angle to enhance etching of the sidewall surface of the first layer.

In another form, a method is provided for etching a metal gate electrode. In the method, a dielectric layer, metallic layer and polysilicon layer are formed in sequence over a substrate, and the polysilicon layer is anisotropically etched, resulting in a patterned polysilicon layer being formed over the metallic layer having a sidewall surface on which is formed a sidewall polymer layer. In a selected embodiment, the sidewall polymer layer may be replaced with a sidewall dielectric layer formed from a fluorocarbon polymer or by oxidizing or nitridating an exposed sidewall surface of the patterned polysilicon layer. By applying an angled etch process, such as a plasma etch process which charges the sidewall dielectric layer, the metallic layer is etched using the patterned polysilicon layer and sidewall dielectric layer for alignment to obtain an etched metal gate electrode having a substantially vertical sidewall. In operation, the angled etch process stores charges in the sidewall dielectric layer to establish a localized electric field which causes the plasma ion impact trajectory to be substantially perpendicular to a corner surface of the metallic layer being etched.

In yet another form, a method is provided for forming metal gates in a semiconductor device. Under the method, a polysilicon layer is patterned and etched down to an underlying metallic layer to form an etched polysilicon structure having a sidewall surface on which is formed a polymer layer. After the polymer layer is etched from the sidewall surface of the etched polysilicon structure to expose an additional surface area of the underlying metallic layer, a thin nonconductive coating is formed on the sidewall surface of the etched polysilicon structure. Next, the underlying metallic layer is etched with a charge prone plasma that charges the thin nonconductive coating to establish a localized electric field which directionalizes ions in the plasma to etch corner edges of the underlying metallic layer, thereby forming a metal gate having an etched metallic layer with vertical sidewalls. The thin non-conductive coating may optionally be removed after etching the underlying metallic layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values, and any specified etch chemistries are provided for illustration purposes only. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure, comprising:
   forming a first metallic layer over a substrate;
   depositing a polysilicon layer on the first metallic layer;
   anisotropically etching the polysilicon layer down to the first metallic layer to form an etched polysilicon structure having a sidewall surface on which is formed a polymer layer;
   removing the polymer layer from the sidewall surface of the etched polysilicon structure to expose an additional surface area of the first metallic layer; and
   plasma etching the first metallic layer using the etched polysilicon structure for alignment to obtain an etched first metallic layer having a substantially vertical sidewall.

2. The method of claim 1, further comprising forming a dielectric layer on the sidewall surface of the etched polysilicon structure after removing the polymer layer and before plasma etching the first metallic layer.

3. The method of claim 2, where forming a dielectric layer comprises forming a fluorocarbon polymer film.

4. The method of claim 2, where forming a dielectric layer comprises oxidizing the sidewall surface of the etched polysilicon structure using an oxygen plasma.

5. The method of claim 2, where forming a dielectric layer comprises nitridating the sidewall surface of the etched polysilicon structure using a nitrogen plasma.

6. The method of claim 2, where plasma etching comprises applying a plasma etch to the first metallic layer, thereby forming a sidewall surface of the first metallic layer while simultaneously charging the dielectric layer to change plasma ion trajectories near the dielectric layer so that plasma ions impact the sidewall surface of the first metallic layer to enhance etching of the sidewall surface of the first metallic layer.

7. The method of claim 1, where the first metallic layer is formed from $Ta_xC_y$, $Ta_xN_y$, or $TaSi_xN_y$.

8. The method of claim 1, where the first metallic layer is formed from $Mo_xN_y$ or $Ti_xN_y$.

9. The method of claim 1, where the first metallic layer is formed from W or $W_xN_y$.

10. The method of claim 1, where removing the polymer layer comprises cleaning the polymer layer using a plasma etch or wet clean process.

11. A method for etching a metal gate electrode, comprising:
    providing a substrate for forming a semiconductor device;
    forming a first dielectric layer over the substrate;
    forming a first metallic layer over the first dielectric layer;
    forming a patterned polysilicon layer having a sidewall surface over the first metallic layer;
    forming a sidewall dielectric layer on the sidewall surface of the patterned polysilicon layer; and
    applying an angled etch process to etch the first metallic layer using the patterned polysilicon layer and sidewall dielectric layer for alignment to obtain an etched metal gate electrode having a substantially vertical sidewall.

12. The method of claim 11, where the angled etch process comprises a plasma etch process which charges the sidewall dielectric layer.

13. The method of claim 11, where the angled etch process stores charges in the sidewall dielectric layer to establish a localized electric field.

14. The method of claim 11, where the angled etch process comprises a plasma etch process in which plasma ions have an ion impact trajectory that is substantially perpendicular to a corner surface of the first metallic layer being etched.

15. The method of claim 11, where forming a patterned polysilicon layer comprises:
    forming a polysilicon layer over the first metallic layer;
    anisotropically etching the polysilicon layer down to the first metallic layer to leave a patterned polysilicon layer having a polymer layer formed on a sidewall surface; and
    removing the polymer layer from the sidewall surface of the patterned polysilicon layer.

16. The method of claim 11, where the sidewall dielectric layer comprises a fluorocarbon polymer.

17. The method of claim 11, where the sidewall dielectric layer is formed by oxidizing or nitridating an exposed sidewall surface of the patterned polysilicon layer.

18. The method of claim 11, where the angled etch process uses a plasma etch reactor with a high source power to charge the sidewall dielectric layer.

19. A method of forming metal gates in semiconductor device, comprising:
    patterning and etching a polysilicon layer down to an underlying metallic layer to form an etched polysilicon structure having a sidewall surface on which is formed a polymer layer;
    etching the polymer layer from the sidewall surface of the etched polysilicon structure to expose an additional surface area of the underlying metallic layer;
    forming a thin nonconductive coating on the sidewall surface of the etched polysilicon structure; and
    etching the underlying metallic layer with a charge prone plasma that charges the thin nonconductive coating to establish a localized electric field which directionalizes ions in the plasma to etch corner edges of the underlying metallic layer, thereby forming a metal gate having an etched metallic layer with vertical sidewalls.

20. The method of claim 19, further comprising removing the thin conductive coating after etching the underlying metallic layer.

* * * * *